United States Patent [19]

Draxelmayr

[11] Patent Number: 4,758,801
[45] Date of Patent: Jul. 19, 1988

[54] DYNAMIC CONTROL SYSTEM WITH SWITCHABLE FILTER-FUNCTION GROUPS

[75] Inventor: Dieter Draxelmayr, Villach, Austria

[73] Assignee: Siemens Aktiengesellschaft, Berlin and Munich, Fed. Rep. of Germany

[21] Appl. No.: 882,583

[22] Filed: Jul. 7, 1986

[30] Foreign Application Priority Data

Jul. 11, 1985 [DE] Fed. Rep. of Germany ....... 3524800

[51] Int. Cl.$^4$ .............................................. H03L 7/00
[52] U.S. Cl. .......................................... 331/8; 331/10; 331/17; 331/25
[58] Field of Search ..................... 331/1 A, 10, 14, 17, 331/25, 8, 116 FE

[56] References Cited

U.S. PATENT DOCUMENTS

| | | | |
|---|---|---|---|
| 3,729,688 | 4/1973 | Cerny, Jr. et al. | 331/1 A |
| 3,909,735 | 9/1975 | Anderson et al. | 329/122 |
| 4,205,272 | 5/1980 | Kumagai | 455/83 |
| 4,482,869 | 11/1984 | Hirata | 331/4 |
| 4,516,083 | 5/1985 | Turney | 331/1 A |

FOREIGN PATENT DOCUMENTS 3120930 12/1982 Fed. Rep. of Germany .

Primary Examiner—Eugene R. LaRoche
Assistant Examiner—Robert J. Pascal
Attorney, Agent, or Firm—Herbert L. Lerner; Laurence A. Greenberg

[57] ABSTRACT

A dynamic control system includes at least one control loop which contains a comparator, a correction device and an adjusting device with a control device wherein a controlled variable is determined and compared with a reference variable for forming a control difference, the correction and the adjusting device operating to provide a given characteristic, a controlled variable being derived by the adjusting device cooperating with a control variable derived from the control device as the output variable wherein the control loop can be coupled to at least one further control loop and/or variable of the dynamic control system, wherein the further control loop includes an adjusting device and wherein the control device contains at least two functional groups having different characteristics, of which at least one is intermittently connected in the signal path of the control difference for generating the controlled variable and a method for operating the dynamic control system.

28 Claims, 5 Drawing Sheets

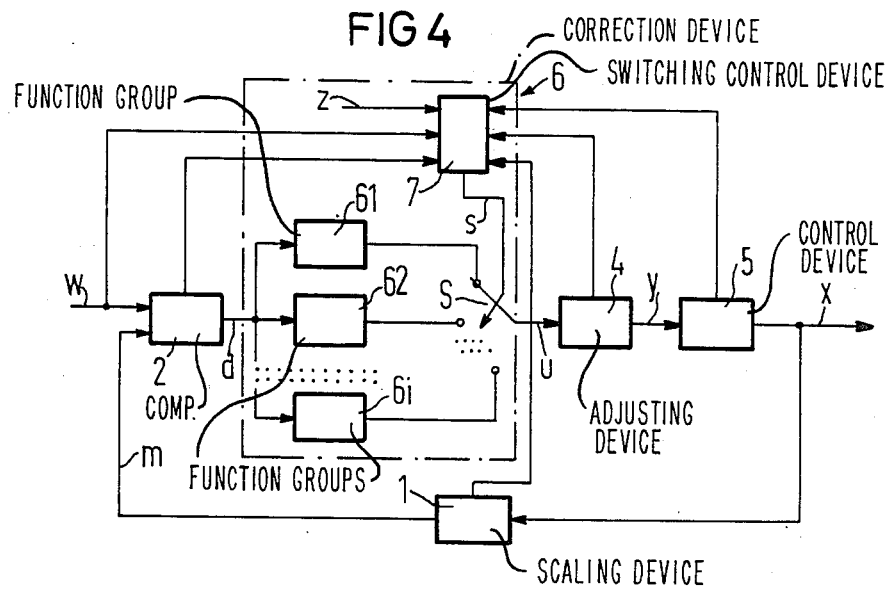
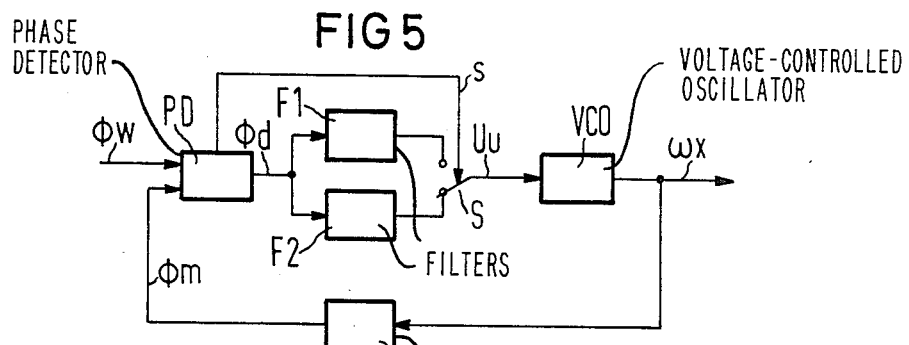
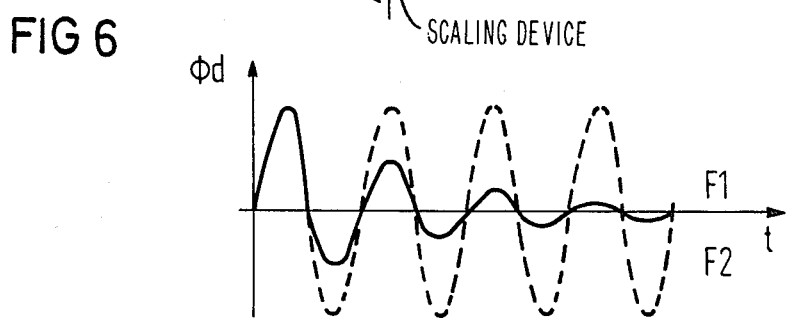

DYNAMIC CONTROL SYSTEM WITH SWITCHABLE FILTER-FUNCTION GROUPS

BACKGROUND AND PRIOR ART OF THE INVENTION

The invention relates to a dynamic control system. The system includes a control loop with a feedback loop connected from the output of the control loop back to one of the two inputs of a comparator which has a time-variable input connected to its other input. The feedback loop typically includes a measuring or scaling device. The comparator forms a control difference d between a measuring variable m from the measuring device and an input reference w. The control d is connected to a correction device, which produces a corrected output, which in turn drives an adjusting device which produces an output driving a control device, which produces an output X.

A typical device of this type is the so-called phase-locked loop, wherein the comparator is a phase detector having one input connected to the input reference variable and the other input connected to the output of the feedback loop, containing the measuring or scaling device in the form of a frequency divider or a multiplier. The output from the comparator is connected to the correction device which in this case may be a filter. The control device is in this case a voltage-controlled oscillator VCO. The phase locked loop will, at all times, attempt to adjust the phase of the output signal to the phase of the reference input signal in such a way that the phase difference $\phi d$ always assumes a defined value, especially 0° or 90°. When the reference input signal changes in frequency or phase, the VCO will always seek to adjust to the changed frequency or phase.

A phase-locked loop, however, has certain limitations in regard to stability, acquisition range and acquisition time. These parameters are largely dependent upon the characteristics of the filter.

Control engineering has a multiplicity of different methods available for the purpose of influencing the time delay behavior of dynamic systems in a targeted manner. Certain time-variable quantities of the system are to be shaped to predetermined waveforms and are to be maintained in that form. In principle, this is accomplished by observing the output variables of the system and a change of the input variables of the system on the basis of the information obtained. In the book "Regelungstechnik" (Control Engineering) by Otto Foellinger, Elitera Verlag, Berlin, 1972, basic structures and methods for linear and time-invariant systems with concentrated (lumped) parameters under the influence of deterministic input variables are treated.

Many of the methods described therein can also be applied to non-linear and time variant systems if the latter can be linearized at least in certain regions. If the operating range of the system extends beyond these linearized regions or if there are dead times, distributed parameters or stoichiometric interference variables or is simply an arrangement of a control system which is very complicated, for instance, due to coupling of the variables, it is thérefore often not even possible to realize the absolutely necessary requirement as to stability of the control loop with respect to the reference quantities and the interference quantities. Farther-reaching requirements as to the control characteristics, for instance, as to an optimum transient behavior, parameter optimization or control for finite settling time, in particular for optimum control as to speed are therefore not possible, to begin with.

It is accordingly an object of the invention to provide a dynamic control system which overcomes the hereinafore-mentioned disadvantages of the heretofore-known devices of this general type and to provide a dynamic control system which has at least one settable system characteristic in a wide operating range.

SUMMARY OF THE INVENTION

With the foregoing and other objects in view, there is provided, in accordance with the invention, a dynamic control system including at least one control loop with a feedback loop which contains a comparator, in which a controlled variable is determined and compared with a reference quantity w for forming a control difference d; a correction device responsive to the operating to provide a given characteristic, the controlled variable being derived by the adjusting device operating with the control variable derived from the control device as the output variable wherein the control loop can be coupled to at least one further control loop and/or variable of the dynamic control system, the at least one control loop including at least two functional groups having different characteristics, at least one of which is intermittently connected in a signal path of the control difference for generating the controlled variable.

In accordance with another feature of the invention, the functional groups having different characteristics are connected in parallel.

In accordance with an additional feature of the invention, the control loop includes a switch for switching-in the functional groups having different characteristics.

In accordance with an added feature of the invention, one of the functional groups having different characteristics is connected into the signal path of the control difference for generating the controlled variable.

In accordance with an additional feature of the invention, at least two of the functional groups having different characteristics are connected in parallel into the signal path of the control difference for generating the control variable.

In accordance with a further feature of the invention, there is provided an interference and a reference variable, wherein the switch can be switched under control of the state of at least one of: the adjusting device, the control system, a comparator, the measuring device, the system parameters of the control system, the interference variables, the reference variable and the time.

In accordance with still another feature of the invention, the switch can be switched selectively, in one of the modes: discretely or continuously.

In accordance with still an added feature of the invention, the functional groups having different characteristics include filters having different filter characteristics.

In accordance with still an additional feature of the invention, the functional groups have different characteristics and are controllingly connected to the input circuits of the adjusting device in turn operatively engage the control device.

In accordance with still a further feature of the invention, the functional groups having different characteristics are formed by connecting to one functional group having one characteristic additional characteristic means by means of a switching for achieving a different overall characteristic.

In accordance with again another feature of the invention, the control system is designed as a digital system.

In accordance with again an additional feature of the invention, the control system is designed as an analog system.

In accordance with again an added feature of the invention, there is provided a phase-locked loop circuit, a phase detector included in the comparator, at least one filter included in the correction device, a voltage-controlled oscillator included in the control device having an input circuit and an oscillating signal as the input variable and a frequency measuring device as the measuring device.

In accordance with again a further feature of the invention, at least one of the filters have lowpass characteristics.

In accordance with yet another feature of the invention, there are provided integrating stages for realizing the lowpass characteristics of the filters.

In accordance with yet an added feature of the invention, the two parallel filters having different filter characteristics included in the correction device and include a switch for switching the filters.

In accordance with yet an additional feature of the invention, the filter having one filter characteristic is included in the correction device and can be modified to another filter characteristic by means of a switch.

In accordance with yet a further feature of the invention, the integrating stage is formed as a filter and includes two voltage-controlled reference current sources in the filter, the current sources being switchable by means of a switch, the integrating stage being an input circuit for the voltage-controlled oscillator.

In accordance with again an additional feature of the invention, the integrating stage is formed as a filter, and includes a voltage-controlled reference current source which includes a first reference current and can be switched to another reference current by means of a switch, the integrating stage forming an input circuit for the voltage-controlled oscillator.

In accordance with again an added feature of the invention, the switch is controlled by the phase detector depending upon the state thereof.

In accordance with again a further feature of the invention, the switch is controlled by the phase detector, depending on the sign of the control difference formed thereby.

In accordance with still an additional feature of the invention, the voltage-controlled oscillator includes a capacitor which can be charged and discharged by switchable current sources and a control network controllable by the capacitor, the control network being connectable to current source switches for switching the current sources and to the output of the voltage-controlled oscillator.

In accordance with still an added feature of the invention, there is provided a plurality of inverter stages and including a Schmitt trigger included in the control network for determining the output state of the voltage-controlled oscillator and the inverter stages.

In accordance with still another feature of the invention, there is provided two anti-parallel circuits being part of the current source switches and being connected oppositely in regard to the reference potential for the control network.

In accordance with still a further feature of the invention, the voltage-controlled reference current source includes an output transistor of a first conductivity type, the output circuit of which carries a reference current and the input circuit of which is controlled by the input circuit of another transistor of the same conductivity type, which is connected as a diode and forms a current mirror with the output transistor, the output circuit of the other transistor being connected to one and another one of two parallel branches of which one branch includes in series two transistors of the second type and a resistor and the other branch includes in series a transistor of the first type and a transistor of the second type and a resistor, of which the resistors have different resistance values and the input to the transistor of the second type in the one branch, and the transistor of the first type in the other branch are commonly connected and form the voltage-controlled reference current source.

In accordance with yet an added feature of the invention, the voltage-controlled reference current source is formed by at least one output transistor of the first type of which the output circuit carries a reference current and of which the one terminal of the output circuit is connected to one terminal of the output circuit of a transistor of the first type which is connected as a diode and forms a current mirror with the output transistor, that, between the input circuit of the output transistor is connected an output circuit of a further transistor of the first type and, between the junction points of the output circuit of the further transistor and the input circuit of the output transistor, and of the output circuits of the output transistor and the transistor connected as a diode, the output circuit of a switching transistor of the first type is connected in series with a resistor, that is in series with the output circuit of the transistor connected as a diode, the output circuit of an input transistor of the second type is connected, and the input thereof is connected to another resistor, the transistor connected as a diode being connected at its free terminal to the input circuit of the further transistor, and that the inputs of the input transistor and of the switching transistor form the respective inputs of the voltage-controlled reference current source.

In accordance with yet a further feature of the invention, there is provided at least two parallel output transistors included in the voltage controlled reference source; an electronic switch connected at one side to one of the output transistors, a capacitor connected at one terminal to the other side of the electronic switch; a further electronic switch; a first current mirror transistor controllably connected to the further electronic switch; a second current mirror transistor connected in series with the first current mirror transistor, at least one transistor connected as a diode connected in series with the further electronic switch, the diode-connected transistors being connected in series with the other one of the output transistors.

In accordance with yet an added feature of the invention, the system is constructed as a digital system.

In accordance with yet an additional feature of the invention, the system is constructed as an analog system.

With the objects of the invention in view, there is also provided a method for operating a dynamic control system having a control loop and including a switch being controlled by a plurality of time-variable parameters and having time-invariant switchable system parameters, which comprises: switching-over the switch in dependence on at least one of: the state of the system parameters, the state of an adjusting device, the state of system parameters of the control system, the state of a comparator, and the state of a measuring device; and responding to at least one of: an interference quantity, and a reference variable and in dependence on the time.

In accordance with yet a further mode of the invention, there is provided a method for operating a dynamic control system, characterized by switching-over the switch in the mode of one of: discrete switching or continuous switching.

In accordance with again an additional mode of the invention, there is provided a method for operating a dynamic control system according to claim 31, including switching the system parameters depending on the state of a phase detector and depending on the sign of the control difference ($\phi$d) to be formed by a phase detector.

In accordance with a concomitant mode of the invention, there is provided a method for operating a dynamic control system including current source switches that are switched, including: switching antiparallel branches of control networks having control outputs; and charging and discharging a capacitor controlling a voltage-controlled oscillator.

Other features which are considered as characteristic for the invention are set forth in the appended claims.

Although the invention is illustrated and described herein as embodied in a dynamic control system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

BRIEF DESCRIPTION OF THE DRAWINGS

FIG. 4 is a block circuit diagram of an embodiment of the dynamic control system according to the invention;

FIG. 5 is a block circuit diagram of a PLL control loop shown as a concrete embodiment of a control system according to FIG. 4;

FIG. 6 is a graph illustrating the operation of an analog control system according to FIG. 5;

FIGS. 10a, 10b and 10c are schematic circuit diagrams of two embodiments of a switchable voltage-controlled reference current source according to the invention as shown in FIGS. 10b and 10c, as compared with a voltage-controlled reference current source according to the state of the art as shown in FIGS. 10a.

DESCRIPTION OF THE PREFERRED EMBODIMENTS

Figure 1:
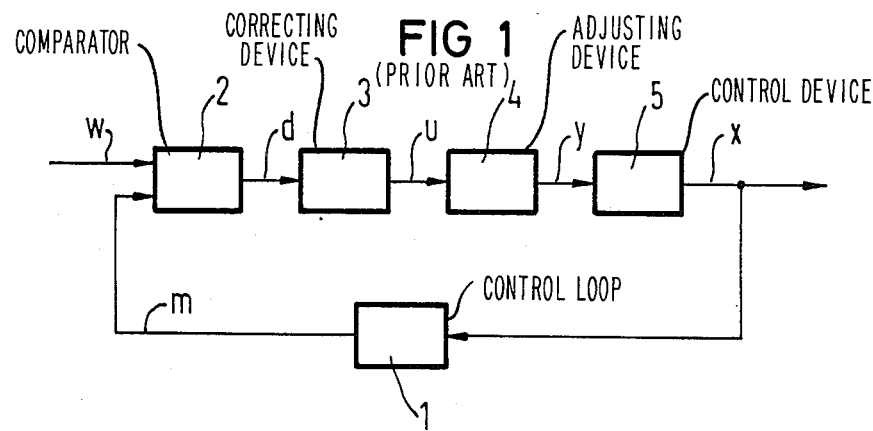
FIG. 1 is a block circuit diagram of a general linear, time-variant dynamic system.

Referring now to the figures of the drawing and first, particularly, to FIG. 1 thereof, there is shown a block diagram of a control loop of a dynamic control system. By means of a scaling or measuring comparator 2, a controlled variable x is determined and a measuring variable m is derived which is compared in the comparator 2 with a reference variable w. In the comparator 2, a control difference d is formed, from which a control variable u or a controlled variable y is derived by means of a correcting device 3 and an adjusting device 4 having an output variable y representing control characteristics of the control loop to be achieved, which acts on the control device 5 having the controlled variable x as the output variable. In certain cases, the control loop is simplified, if for instance, the control input can serve, without measurement conversion, directly as an input variable of the comparator device 2 or if no adjusting device 4 is necessary for addressing the control device 5, i.e., if the controlled variable u can act directly as the controlling variable y. In principle, a dynamic control system can have a considerably more complicated block diagram in which several control loops according to FIG. 1 can be coupled to each other and/or to other variables of the dynamic control system.

Figure 2:
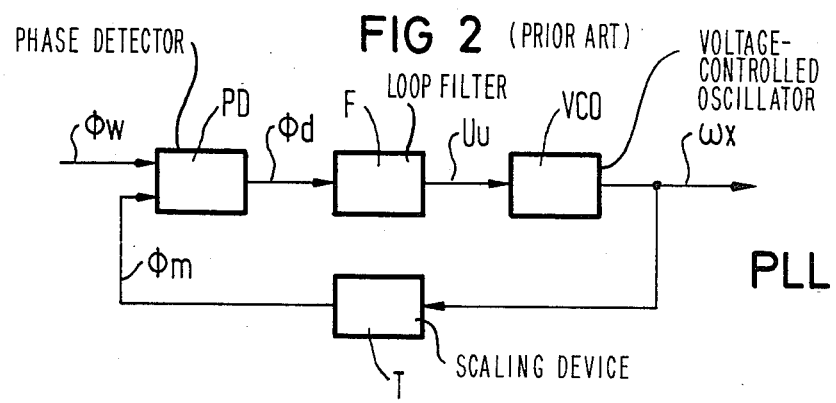
FIG. 2 is a block circuit diagram of a more specific time-variant dynamic system formed as a phase-locked loop (PLL)

As a concrete embodiment example of a control loop, FIG. 2 shows the block diagram of a phase-locked loop (PLL). In FIG. 2, the comparison device is formed by a phase detector PD, the correcting device by a loop filter F, the control device with control path by a voltage controlled oscillator VCO and the scaling or measuring device by a frequency divider T. The PLL attempts to readjust the determined phase $\phi$m of the frequency wx of the output signal of the phase $\phi$w of the reference frequency in such a way that the phase difference $\phi$d always assumes a defined value, especially 0° or 90°. Input variables of the phase detector PD may also be the reference frequency itself and the determining output frequency. If the operating behavior of the PLL is stable, the frequency wx of the output signal of the VCO is synchronized with the frequency of the reference signal; the PLL is "locked in". The frequency wx of the output signal can definitely be a multiple or a fraction of the frequency of the input signal. In such a case, the frequency divider T adapts the signal $\phi$m required for the phase detector PD to the phase signal $\phi$w of the reference signal. Examples of a VCO are represented by a Schmitt trigger with a controllable repetition frequency or by a motor with a controllable speed.

If the divider ratio of the frequency divider T or the reference frequency is changed, the PLL must assure the renewed synchronization of the reference signal with the output signal even if the control loop can fall out of step for a short time. On the other hand, there are applications in which PLL circuits, which can be realized digitally as well as analog, must not fall out too far so as not to suppress pulses or oscillations. The capture range of the PLL circuit is located in a given frequency range about the center frequency of the PLL. The holding range of a PLL on the other hand, extends over a substantially wider frequency range. The capture range and the holding range indicate the frequency at which an unlocked PLL is synchronized or a locked PLL falls out of step. The center frequency is understood to mean the frequency, relative to which modulation can take place. Further synchronization ranges can occur at harmonics or subharmonics of the reference frequency where, however, the corresponding holding and capturing ranges become smaller as a rule.

Especially at low frequencies with respect to the center frequency and in frequency multiplier circuits, stabilization problems can arise which manifest themselves as phase jitter or phase variations. Especially with a slight amount of damping that may be necessary or of overcompensation, a tendency to oscillate may occur. In frequency multiplying circuits, especially with a large divider ratio, phase stability can generally be achieved only with great difficulty since always several periods of the output signal have already passed, before a readjustment can be made via the phase detector PD and the correction device.

Even in simpler PLL circuits a tendency to oscillate can arise especially due to non-linearities, dead times or asymmetries. Such a circuit is obtained from FIG. 2, for instance, due to the fact that the frequency divider T is omitted and the output frequency of the VCO is fed back directly to the phase detector PD. The output variable of the control loop, like in the block diagram according to FIG. 2, can be the output frequency of the VCO as well as its control voltage $U_u$. If the control voltage $U_u$ is itself the output variable, parasitic properties of the VCO can have a direct effect on the stability of the circuit.

In many cases stability can be achieved in limited ranges by optimizing the loop filter F and the external VCO wiring. This optimized external wiring, however, is generally valid only in a relatively narrow range and in particular, does not make sense, for instance, in an integrated circuit for general customer-specific requirements.

The phase detector PD is formed in analog systems by a multiplier network and in digital systems by gates, for instance, NAND or EXOR gates. The loop filter F following in the line of the signal path has a lowpass characteristic in order to blank out signal oscillations of higher frequency. The loop filter F is commonly a PI stage shown in FIG. 3, where P and I stand for proportional and integrating modes of operation. The signal input E of the filter is connected via the resistor R1 to the output A which in turn is connected by the series circuit of a resistor R2 and a capacity C to a terminal B at reference potential. Other, especially active embodiments of the loop filter F are customary. In the design of such a filter F, care must be taken that it must just still have an integrating effect for low frequencies, for which purpose the capacity C should be chosen as large as possible. This measure which influences the stationary accuracy of the control loop, however, is contrary to the requirement for fast control at high frequencies which call for a proportional control behavior and therefore, for a small capacity C, so that a small time constant is obtained in conjunction with the resistor R1. The resistor R2 is a damping resistor.

Figure 3:
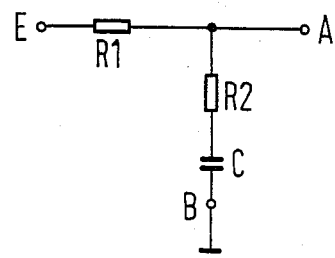
FIG. 3 is a schematic circuit diagram of the loop filter seen in FIG. 2.

Under the assumption that a PLL control loop according to FIG. 2 with a loop filter F according to FIG. 3 can be linearized in the control-engineering treatment and can be considered as continuous in time, the circuit is generally stable only as long as the damping is great enough, i.e. as long as the resistance R2 is not negligibly small as compared to the resistance R1. From this follows a tendency to instability in applications in which low damping is required. The behavior of the control loop is further degraded as a rule by the fact that the ideal physically real properties of the elements of a circuit cannot be fully assumed in the design of the loop filter F.

Stable behavior, however, represents only the basic requirement for a dynamic control system. In almost all applications, further-going requirements must be met in order to achieve a given system characteristic. Particularly in control systems which must cover a wide range of applications or in which optimizing is required, these requirements can be met by control loops according to FIG. 1 only with difficulty or not at all. As further embodiment examples can be mentioned in this connection an optimum-speed positioning control with non-linear elements or a gain control with dead-time stages. In optimum-speed positioning controls, an element to be controlled is to be brought into a given position by means of a positioning motor, for which purpose the latter is operated as maximum speed until the element has arrived in the vicinity of the end position; subsequently, the positioning motor is to approach the end position with now optimum speed. In a gain control circuit with dead time, on the other hand, constant-current charging or discharging of, for instance, large capacities is conceivable as soon as large variations of the supply voltage occur, while in regular operation a behavior is desired which can be managed by conventional means.

Dynamic control systems described above have a control variable u, which is a function of time, the parameter vector of the controlled system or the state vector of the control system. These parameters influence alternatively the parameters of a correction device 3 according to FIG. 1, which can be optimized, as described, only within certain limits.

As mentioned above, it is an object of the invention to provide a dynamic control system which has at least one settable system characteristic in a wide operating range.

The basic idea of a control system according to the invention consists of varying the control parameters of the correction devices under time, state or parameter control in such a manner that a given characteristic of the control behavior is obtained. To this end, the correction device contains at least two functional groups with different characteristics, of which at least one is not corrected continuously, for deriving the regulated variable in the signal path of the control difference.

The scope of the invention also includes a time, state or parameter-controlled variation of the parameters of a positioning device of a positioning device with a control path, for instance, of its input circuit. Alternatively, or as a supplement to the correction device, these blocks then contain at least two functional groups with different characteristics, of which at least one is not connected continuously to the signal path of the control difference variable for deriving the positioning variable.

The invention can be applied to control circuits with a general structure which can be described, for instance, by a parameter vector or a state vector. Among these are adaptive control systems, in which the parameters of the correction device are matched to the parameters of the control system in such a manner that a quality criterion with a specified value or an extreme value is obtained, where the control parameters can be varied as a function of the instantaneous state of the control system.

A state vector contains state variables as elements; these are location-and time-dependent quantities. The state variables are obtained from a given number of location-dependent functions which completely describe the instantaneous state of a system at a given point in time, taking into consideration the variations of these functions resulting from advancing time according to the physical conditions of the system. State variables can be used to advantage in a dynamic control system according to the invention, also for non-linear, time-variant variables including dead times.

FIG. 4, which relates to the invention of the instant application, differs from FIG. 1 in regard to the correction device 3. While the correction device 3 according to FIG. 1 contains a functional group with a characteristic, the correction device 6 as seen in FIG. 4 according to the invention, has at least two functional groups with different characteristics. The latter are symbolized by the functional groups 61 and 62 and may, for instance, have the character of a lowpass filter wherein one of the two functional groups 61 or 62 is not damped and the other, with damping can act in response to the control difference d. It is indicated by rows of points and a branch with a functional group 6i that the correction device 6 can contain further functional groups which serve for deriving the control variable u from the control difference d.

Alternatively or as a supplement thereto, the adjusting device 4 contains at least two functional groups with different characteristics, for instance, different input circuits for deriving the adjusting variable y from the control difference d, although such an embodiment example is not shown in the block with reference numeral 7.

According to the invention, at least one of the functional groups for instance 61, 62 to 6i, is not permanently connected into the signal part of the control difference d. This purpose is served in the embodiment example according to FIG. 4 by the control switch 5 which switches-in only one respective functional group, in the example, the group 61, into the signal path. As control switches can be considered any type of switches known per se, for instance, mechanical, hydraulic or electronic designs. The switching signal s is derived from a switching control device 7 which, depending on the overall characteristic of the control loop to be achieved, has relevant input variables which are derived from the other blocks of variables of the dynamic control system, for instance, the input variable w, the acquisition scaling or measuring device 1, the comparator 2, the adjusting device 4 and the control device 5. In addition, external interference variables z can influence the switching criterion.

The switching variables s can accordingly be a function of time, the state vector or a parameter vector. In this manner, optimizing criteria can be obtained via the switch S on the control behavior and the correction device 6.

It is within the scope of the invention that one or more of the functional groups 61, 62 to 6i serve simultaneously for producing the adjusting variable y, advantageously provided with weighting. Besides the parallel circuit of the functional groups 61, 62 to 6i shown in FIG. 4, also a series-parallel circuit can be considered for arranging them, especially with an adjusting device 4, according to the invention. It is essential for the invention that at least one of the functional groups 61, 62 to 6i does not influence adjusting variable y permanently. The switching variable s can provide continuous switching, besides discrete switching, in which also different combinations of the functional groups 61, 62 to 6i fall within the scope of the invention. This case frequently prevails in the case of non-ideal switch characteristics.

It is immaterial for a dynamic control system according to the invention, whether the concrete embodiment is conceived as a digital or an analog system. As embodiment examples of such a digital control system, the already mentioned speed-optimizing adjusting control 4 or an amplifier circuit with dead time can be cited here. However, in the following the PLL circuit of which the principle of operation has already been explained in connection with FIG. 2, will be discussed in detail.

FIG. 5 shows the block diagram of an embodiment example of a PLL circuit according to the invention. FIG. 5 differs from the block diagram according to FIG. 2 by the fact that the phase difference $\phi d$ is not fed to a signal loop filter F, but to two filters F1 and F2. By means of a switch S switching is performed between the two loop filters for deriving the control variable Uu; the control variable s for the switch 5 is derived in FIG. 5 from the phase detector PD. Depending on given operating states, switching to the optimum filter characteristic can be effected for obtaining an improved operating behavior.

Alternatively, or as a supplement, the adjusting device with a control path (in the embodiment example according to FIG. 5, the voltage controlled oscillator VCO) can comprise two functional groups with different characteristics, in particular, two input circuits, between which switching can be performed. In this case, a loop filter F can be constructed in accordance with the state of the art or can contain an integrating or holding element, for instance, a capacitor.

Although a non-linear time-variant network is involved, according to FIG. 5, such a PLL circuit can be used over a wide operating range especially at low frequencies in the presence of asymmetries, dead times and non-linearities; preferably for improving the stability behavior. Such a circuit arrangement is preferably suited for digital PLL circuits but also for analog PLLs. The fundamental assumption is in every case that the switching speed of the controlled switch S is sufficiently high as compared to the behavior of the remaining control loop members, so that influence due to switching the switch S itself remains small.

A general mathematical description of a PLL circuit according to FIG. 5 is difficult since a non-linear time variant system is involved. For visualization it is sufficient, however, to linearize the system and to consider it as quasi-continuous. In this case there are certain regions of time in which the system can be treated by linear control theory according to the state of the art and in which the behavior of the real physical system is reproduced faithfully.

The diagram according to FIG. 6, in which the phase difference $\phi d$ is plotted versus the time t, serves to explain such a system which can be considered as quasi continuous. It is assumed here that the switching between the filters F1 and F2 is accomplished in dependence on the sign of the phase difference $\phi d$. Both filters should have lowpass behavior and can be designed either passively according to FIG. 3 or actively.

They differ only by the fact that the filter F1 has no damping but the filter F2 does have damping.

In FIG. 6, the broken line shows the waveshape of the phase error φd for the case that only a filter without damping is provided. The amplitude of the phase error φd, i.e. the control difference in the waveform remains visible, so that the control loop is unstable either dynamically or in the steady state. If, on the other hand, the switch S switches at the correct time from the undamped filter characteristic of the filter F1 to the damped characteristic of the filter F2, then the entire wave is damped. In the diagram according to FIG. 6, the characteristic of the filter F2 is switched-on for this purpose in the case of a negative phase error, and the characteristic of the filter F1 in the case of positive errors. The then damped course of the phase error is given by the solid line, from which a stable behavior of the control loop becomes recognizable. While in this example a labil or unstable behavior of the control loop occurs as the operating behavior with little damping, FIG. 7 shows a diagram for an operating case in which permanent heavy damping leads to instability.

Figure 7:
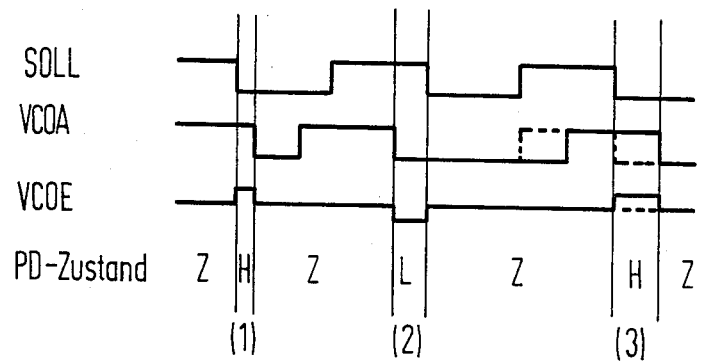
FIG. 7 is a graph illustrating the requirements as to the damping behavior of the correction device of a digital control circuit descrete in time according to FIG. 5.

FIG. 7 shows an example for a time-discrete wave of a digital PLL circuit. As the phase detector PD serves a network which generates three possible output states. If the phase of the output signal, of the voltage-controlled oscillator is delayed relative to the phase of the input signal, the phase detector generates a signal "high" (H), and in the opposite case of a lead-in time, relative to the phase of the output signal, a signal "low" (L). In the times in between, when no correction signal is formed, the phase detector PD is at a mean value between the states "high" and "low", and no change takes place at the input of the VCO. It can be seen from the diagram according to FIG. 7, that an output signal of the phase detector PD is formed in the form of a signal H or L only by comparison of the trailing edges of the reference wave and the output wave of the VCO and has a correcting effect on the input of a VCO.

At the time (1), the phase of the reference wave SOLL leads the phase of the output wave VCOA of the VCO, i.e., at the output of the phase detector PD there appears a state H which substantially accelerates the next state change at the output of the VCO due to a large gain to which a large damping corresponds. For the next comparison interval (2), the phase relations are the opposite, i.e., the trailing edge of the output wave VCOA of the VCO leads the trailing edge of the reference wave SOLL, while the phase error has even become considerably larger. Due to the now great delay of the next state change of the output signal of the VCO, the sign of the phase error is again changed, with a simultaneously larger magnitude of the error. In this manner the system is fanned up ("speeded-up") and becomes unstable.

In the simple considerations above relating to the diagram according to FIG. 7, the real physical behavior is not taken into consideration entirely faithfully. While the phase error will increase due to the high gain from the comparison interval (1) to (2), but not from the comparison interval (2) to the comparison interval (3), the reason for this behavior is that the VCO cannot generate negative frequencies or operate backwards. Therefore, the VCO, in the worst case, will interrupt its oscillations for the duration of the comparison interval (2) and resume its normal operation at the beginning of the comparison interval (3). It is assumed that the capacity C of a loop filter according to FIG. 3 is chosen largely to keep the voltage approximately at a constant level for this interval. In this case a wave indicated by the dashed line is obtained, in which the phase error disappears. While thus large damping is desirable for negative phase errors, the damping must not become too large for positive phase errors.

Figure 8A:
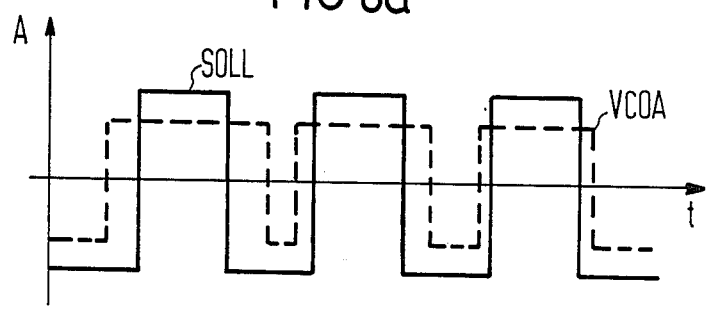
FIGS. 8a and 8b are two graphs illustrating the control behavior of a digital control circuit, discrete in time, according to FIG. 5.
Figure 8B:
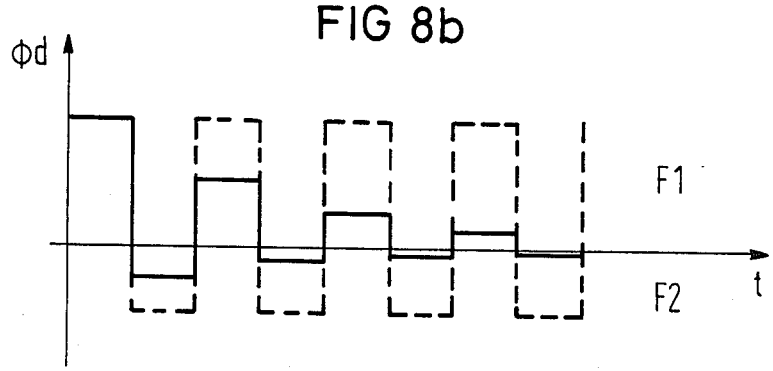

FIGS. 8a and 8b serves for explaining the strategy to be derived for the control variable s for a time-discrete phase control circuit according to FIG. 5. In FIG. 8a the waveshapes of the amplitudes of the reference function SOLL and the output function VCOA of the voltage-controlled oscillator are plotted. In this connection, FIG. 8b explains the waveshape of the phase error φd if, in an embodiment example according to FIG. 5, switching takes place between the filter characteristics of the filter F1 and F2. In the case of negative phase errors, a large damping of the filter F2 exists while for positive phase errors, a damping F2 is smaller or disappears.

The waveshape of the amplitudes according to FIG. 8a shows that the phase error φd decreases fast and the system is stable. In the diagram according to FIG. 8 it is permitted that the control system operates as a keyed system in a modulo-two oscillation, is non-linear and discrete in time, contains dead time and the phase error oscillates at the highest possible frequency, i.e., half the sampling frequency. The system remains stable even under these extreme operating conditions.

Figure 9:
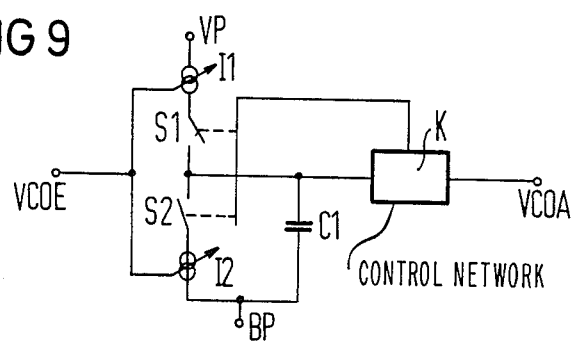
FIG. 9 is a basic schematic and block circuit diagram of a voltage-controlled oscillator.

The same diagrams as in FIGS. 6 to 8a and 8b are obtained if one loop filter F and two switchable input circuits of the VCO are provided instead of two loop filters F1 and F2 and one input circuit of the VCO. FIG. 9 shows a basic circuit diagram of a voltage-controlled oscillator (VCO). The latter contains as the essential elements a charging capacitor C1 which is charged and discharged by the switchable voltage-controlled current sources I1 and I2. For controlling the switches S1 and S2 serves a control network K. In detail, the input VCOE of the voltage-controlled oscillator to which a voltage is applied in operation, is connected to the two current sources I1 and I2 in order to control their current. One pole of the current source I1 is connected to a terminal VP connected to a supply potential; the other pole is connected to one contact of the series-connected switch S1. The other contact of the switch S1 is connected to one contact of the series-connected switch S2, the other contact of which is connected to one pole of the again series connected current source I2, the other pole of which is connected to a terminal BP which is a reference potential.

The charging capacity C1 is connected between the junction point of the two switches S1 and S2 and the terminal BP carrying reference potential. The Junction point of the two switches S1 and S2 is further brought to the input of a control network K shown as a block in FIG. 9. One output of this control network K is connected to the output VCOA of the voltage-controlled oscillator; the other one controls the switch positions of the switches S1 and S2. In FIG. 9, both switches are shown open and the circuit is not ready for operation. By closing one of the switches S1 or S2, the capacitor C1 is either charged via the current source I1 or is discharged via the current source I2. It is therefore the purpose of the control network K to switch the switches S1 and S2 on or off oppositely. Preferably, the control network K therefore contains a Schmitt trigger with inverters, the output or outputs of which are connected to the control elements of the switches S1 and S2 and the output terminal VCOA.

The amplitude of the voltage present at the input VCOA determines the current through the current sources I1 and I2 and thereby by charging and discharging behavior of the capacitor C1 or the wave generated at the output VCOA by means of the control network K. Thus, faster switching of the output state is obtained at the output VCOA of the VCO with a higher voltage present at its input VCOE due to the faster charging of the capacitor C1. This case corresponds to the time (1) according to FIG. 7. Inversely, a lower voltage at the input VCOE of the VCO during the discharge phase of the capacitor C1 means a longer discharging time and thereby a delayed state change of the output VCOA of the VCO.

Figure 10A:
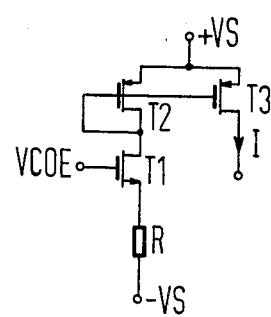
Figure 10B:
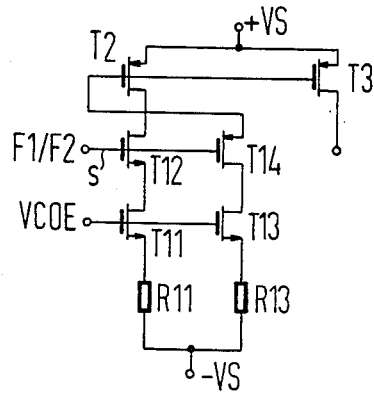
Figure 10C:
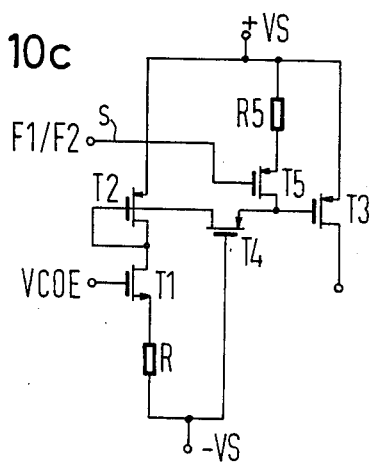

FIG. 10 shows embodiment examples for input circuits of integrable voltage-controlled oscillators. For comparing the examples detailed in FIGS. 10b and 10c according to the invention serves the circuit section according to FIG. 10a, known, per se, for an explanation of a voltage-controlled current source. The active elements in FIG. 10a, 10b and 10c are MOS transistors in CMOS technology. The input of the circuit is formed in FIG. 10a by the terminal VCOE which is connected to the gate of an n-channel transistor T1. The source terminal of T1 is connected via a resistor R to the negative supply voltage −VS which represents reference potential. The drain terminal of T1 is connected to the drain terminal and the gate of a p-channel resistor T2, the source of which is at the positive supply voltage potential +VS. Parallel to the transistor T2 is connected the transistor T3, likewise with its source to the positive supply voltage potential +VS and with its gate to the gate of the transistor T2. The drain terminal leads to the circuit parts which follow signalwise via a terminal, not specifically designated.

With a gate voltage of the transistor T1 sufficiently high as compared to its source voltage, the transistor T1 as well as the transistor T2 connected as a diode is switched into conduction. Then, a current depending on the gate voltage of the transistor T1 flows through the source-drain paths of the transistors T1 and T2 as well as the resistor R. By the potential which settles at the gate of the transistor T2 and thereby of the transistor T3, a current is impressed on the transistor T3. The current mirror arrangement consisting of the transistors T2 and T3 is used in the integrated technology for realizing flow ratios between the currents in the transistor connected as a diode and a current source transistor proper.

In FIG. 10a, a voltage change at the input of the circuit section acts directly on the current flowing through the resistor R and thereby on the potential at the gate of the transistor T3 so that the output current I changes. Thus, a transformation of the input voltage into a reference current is obtained which is responsible for the magnitude of the charging and discharging current of a capacitor of a VCO according to FIG. 9.

According to the arrangement described with the aid of FIG. 10a, FIG. 10b shows a partial circuit arrangement, by which two different input circuits of a VCO of a PLL circuit according to the invention can be realized with only a single loop filter. The circuit of the transistor T2 with respect to the supply voltage potential +VS and of the transistor T3 remains the same, while, in contrast to FIG. 10a, the junction point of the drain terminal and the gate of the transistor T2 is now connected to two anti-parallel circuits which are connected oppositely in regard to the reference potential −VS.

According to FIG. 10a, each of the parallel circuits contains an n-channel transistor T11 and T13, respectively, the gates of which are connected to each other and to the input terminal VCOE. The source terminals of the transistors T11 and T13 each are connected to each other via a resistor R11 and R13 and to the terminal −VS for the reference potential. In series with the drain-source path of the transistor T11 is connected with the drain-source path of an n-channel transistor T12 which is connected with this drain to the junction point of the gate and the drain of the transistor T2 and with its source to the drain of the transistor T11. Similarly, the source-drain path of the transistor T13 is connected in series with the source-drain path of a p-channel transistor T14, the source of which is connected to the junction point of the gate and drain of the transistor T2 and the drain of which is connected to the drain of the transistor T13. The gates of the transistors T12 and T13 are connected to each other and to a terminal F1/F2.

The transistors T12 and T14 act as a switch in which, depending on the signal s present at the terminal F1/F2, one transistor is always in conduction and the other one is cut off. With an input signal for the VCO present at the terminal VCOE, a current flows thereby through the transistor T2 connected as a diode and thereby through one of the transistors T11, T12 in conjunction with the resistor R11 or through the output circuits of the transistors T13, T14, which in conjunction with the branch of the resistor R13 is reflected into the transistor T3 and is used for charging and discharging a capacitor. Depending on the value of the resistance R11 and R13 respectively, and on the voltage at the terminal VCOE, a current flowing in both circuits is of different magnitude.

In accordance with a PLL circuit according to the invention as per FIG. 5, high damping can be achieved in FIG. 10b, for instance, for negative phase errors and by switching between the transistors T12 and T14 only small damping for positive phase errors. In this manner the switching of the VCO can be slowed down or even stopped.

While according to FIG. 10b, the input of the VCO is switched back and forth between two current sources with different currents, FIG. 10c shows an embodiment example for only a single required loop filter in an input circuit of a VCO with a single current source to which, by means of a signal s present at the terminal F1/F2, a second current characteristic can be connected into the circuit for obtaining a different totalcurrent characteristic.

A first branch which contains the transistors T2, T1 and the resistor R connected in series, corresponds to the circuit according to FIG. 10a which contains the same elements. A transistor T3 which is connected with its source to the positive supply voltage potential +VS and with its drain to a terminal, not specifically designated, for connecting the subsequent circuit, also can be seen from FIG. 10b. Between the gate of a transistor T2 and the gate of a transistor T3, is connected in FIG. 10c, the drain-source path of a p-channel transistor T4, the gate of which is connected to the terminal −VS for the reference potential and to one lead of the resistor R. While the drain terminal of T4 is connected to the gate of T2, the source terminal of T4 is connected to the gate of T3 and the drain of a further p-channel transistor T5. The source terminal of T5 is connected via a resistor R5 to the terminal VS for the supply voltage potential, and the gate of T5 to the terminal F1/F2.

In this example, the transistor T4 acts as a resistor and the transistor T5 as a switch.

For positive phase errors of the phase detector PD, the transistor T5 does not conduct and the two transistors T2 and T3 in connection with the transistor T1 and the resistor R act, like in FIG. 10a, as current mirrors for the current flowing through T1, T2 and R. For a negative phase error, the transistor T5 is switched into the conducting state and the gate potential to transistor T3 is raised. At the same time the gate potential of transistor T2 is raised via T4, so that the current through the current mirror can be decreased or even switched off.

Figure 11:
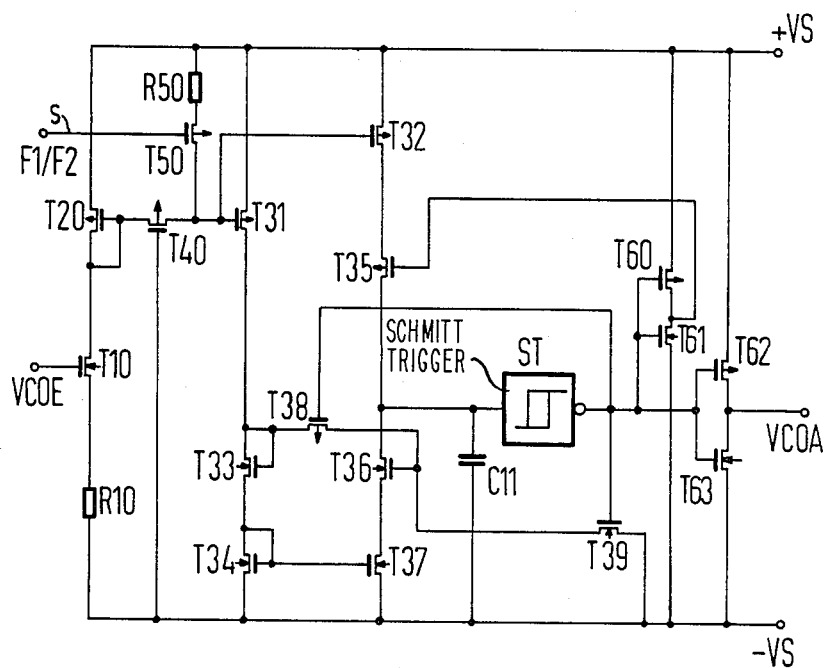
FIG. 11 is a schematic circuit diagram of a concrete embodiment of a VCO with an input circuit according to the invention.

FIG. 11 shows an embodiment example of the circuit according to the invention of a VCO with a switchable voltage-controlled reference current source according to FIG. 10c, for which only a single loop filter, for instance, an integrating or holding member C11, is required. Therein, the elements T10, T20, T40, T50, R10, R50 correspond, in this order, to the elements T1, T2, T4, T5, R, R5 of FIG. 10c. The transistor T3 is provided in duplicate in FIG. 11 by the transistors T31 and T32 which are connected with their gates according to the transistor T3. A terminal of the output circuit of T31 is connected to the terminal +VS of the positive supply voltage; the other one is in series with the output circuit of two transistors T33 and T34 wired as diodes, of which the source of T34 is connected to the terminal −VS of the reference potential. The output circuit of the transistor T32 is connected with one lead to the terminal +VS and with its other lead in series with the output circuits of the transistors T35, T36 and T37, where one terminal of the output circuit T37 is connected to the terminal −VS.

The gate terminal of the transistor T33 is connected to the drain terminal of the same transistor and, via the output circuits of the transistors T38 and T39 to the terminal −VS. The gate of the transistor T36 is connected to the junction point of the output circuits of the transistors T38 and T39.

The gate of the transistor T34 is connected to the drain of this transistor and to the gate of transistor T37.

The capacitor C11 determining the operation of the VCO is connected with one lead to the terminal −VS and with the other lead to the junction point of the output circuit of the transistors T35 and T36 as well as to the input of a Schmitt trigger ST with inverting output. The output of the inverting Schmitt trigger ST controls the gates of the transistors T38 and T39 as well as the gates of the transistors T40, T41 and T42, T43, respectively. The output circuits of the transistors T40, T41 and T42, T43 are each connected in series and between the terminals +VS and −VS of the supply voltage. T40 is complementary to T41, and T42 to T43 and form respective inverters.

While the junction point of the output circuits of the transistors T40 and T41 are connected to the gate of the transistor T35, the junction point of the output circuits of the transistors T42 and T43 represents the output of the circuit which is connected to the terminal VCOA of the voltage-controlled oscillator.

Via the current flowing through the transistors T31 and T32, the capacitor C11 is alternatingly discharged and charged. To this end, the transistors T38 and T39 are switched into conduction from the output of the inverting Schmitt trigger ST when the capacity C11 is being discharged, while, via the inverter consisting of the transistors T40 and T41 and the gate of the transistor T35, the output circuit of the latter is blocked. Then, the transistors T33 and T36 as well as T34 and T37 operate as cascaded current mirrors which discharge the capacitor C11 via the current flowing through the output circuit of the transistor T31, corresponding to the applicable transmission ratios. In this state, the potential of the output terminal VCOA of the voltage-controlled oscillator corresponds to the gate potential of the transistor T35.

When the inverting Schmitt trigger ST is switched as soon as the capacity C11 is sufficiently discharged, the transistors T38 and T39 are cut off, while the transistor T35 is switched into the conducting state. Similarly, the potential of the output terminal VCOA is switched until the capacitor C11 is charged up so far that the inverting Schmitt trigger ST switches once again. In each switching state of the VCO the current through the transistors T31 and T32 and thereby the discharging and charging time of the capacity C11 can be influenced by means of the signal s present at the input terminal F1/F2. According to the invention, the switching of the output state of the VCO can be delayed or even inhibited for each state of oscillation.

The inverting Schmitt trigger ST according to FIG. 11 can be realized circuit-wise by means known per se. In the same figure, the transistors T20, T40, T50, T31, T32, T35, T38, T60 and T62 are of the p-channel type, and the transistors T10, T33, T34, T36, T37, T39, T61 and T63 are transistors of the n-channel type.

The foregoing is a description corresponding in substance to German Application P No. 35 24 800.9, dated July 11, 1985, the International priority of which is being claimed for the instant application, and which is hereby made part of this application. Any material discrepancies between the foregoing specification and the aforementioned corresponding German application are to be resolved in favor of the latter.

I claim:

1. Dynamic control system comprising at least one control loop which contains a comparator, wherein a controlled variable is determined and compared with a reference variable for forming a control difference; a correction device responsive to the control differences for providing the control variable; an adjusting device having inputs, being responsive to the control variable operating to provide a given characteristic; a control device connected to the adjusting device; the controlled variable being derived by the adjusting device cooperating with the control variable derived from the control device as the output variable; at least one further control loop that can be coupled to said control variable of the dynamic control systems, at least two of said control loops each including at least one functional group; said functional groups having different characteristics, at least one of which is intermittently connected in a signal path of the control difference for generating the controlled variable, said functional groups being connected in parallel; at least one of said control loops including a switch for switching-in at least one of said functional groups being connected in parallel into the signal path of the control difference for generating the controlled variable; and an interference and a reference variable; said switch being switched under control of at least one of: the adjusting device, the control system, a comparator, a scaling device, system parameters of the control system, an inteference variable, the reference variable and a time variant variable.

2. Dynamic control system according to claim 2, wherein the switch can be switched selectively, in one of the modes: discretely and continuously.

3. Dynamic control system according to claim 2, wherein the functional groups having different characteristics include filters having different filter characteristics.

4. Dynamic control system according to claim 2, wherein the functional groups have different characteristics and are controllingly connected to the inputs of the adjusting device, which in turn operatively engage the control device.

5. Dynamic control system according to claim 2, wherein the functional groups having different characteristics are formed by connecting to one functional group having one characteristic additional characteristic means by means of a switch for achieving a different overall characteristic.

6. Dynamic control system according to claim 1, wherein said control system is designed as a digital system.

7. Dynamic control system according to claim 1, wherein said control system is designed as an analog system.

8. Dynamic control system according to claim 2, including a phase-locked loop circuit, a phase detector included in the comparator, at least one filter included in the correction device, a voltage-controlled oscillator included in the control device having an input circuit and an oscillating signal as the input variable and a frequency measuring device as the measuring device.

9. Dynamic control system according to claim 8, wherein said filter has lowpass characteristics.

10. Dynamic control system according to claim 9, including integrating stages for realizing the lowpass characteristics of the filters.

11. Dynamic control system according to claim 9, including at least two parallel filters having different filter characteristics are included in the correction device and include a switch for switching the filters.

12. Dynamic control system according to claim 10, wherein said filter having one filter characteristic is included in the correction device and can be modified to another filter characteristic by means of a switch.

13. Dynamic control system according to claim 10, wherein said integrating stage is formed as a filter and includes two voltage-controlled reference current sources in the filter, said current sources being switchable by means of a switch, said integrating stage being an input circuit for the voltage-controlled oscillator.

14. Dynamic control system according to claim 10, wherein said integrating stage is formed as a filter, and includes a voltage-controlled reference current source which includes a first reference current and can be switched to another reference current by means of a switch, said integrating stage forming an input circuit for the voltage-controlled oscillator.

15. Dynamic control system according to claim 14, wherein said switch is controlled by the phase detector depending upon the state thereof.

16. Dynamic control system according to claim 14, wherein said switch is controlled by the phase detector, depending on the sign of the control difference formed thereby.

17. Dynamic control system according to claim 8, wherein the voltage-controlled oscillator includes a capacitor which can be charged and discharged by switchable current sources and a control network controllable by said capacitor, said control network being connectable to current source switches for switching the current sources and to the output of the voltage-controlled oscillator.

18. Dynamic control system according to claim 17, including a plurality of inverter stages and including a Schmitt trigger included in the control network for determining the output state of the voltage-controlled oscillator and the inverter stages.

19. Dynamic control system according to claim 17, including two anti-parallel circuits being part of the current source switches and being connected oppositely in regard to the reference potential for the control network.

20. Dynamic control system according to claim 17, wherein the voltage-controlled reference current includes an output transistor of a first conductivity type, the output circuit of which carries a reference current and the input circuit of which is controlled by the input circuit of another transistor of the same conductivity type, which is connected as a diode and forms a current mirror with the output transistor, the output circuit of the other transistor being connected to one and another one of two parallel branches of which one branch includes in series two transistors of the second type and a resistor and the other branch includes in series a transistor of the first type and a transistor of the second type and a resistor, of which the resistors have different resistance values and the input to the transistor of the second type in the one branch, and the transistor of the first type in the other branch are commonly connected and form the voltage-controlled reference current source.

21. Dynamic control system according to claim 17, wherein the voltage-controlled reference current source is formed by at least one output transistor of the first type of which the output circuit carries a reference current and of which the one terminal of the output circuit is connected to one terminal of the output circuit of a transistor of the first type which is connected as a diode and forms a current mirror with the output transistor, that, between the input circuit of the output transistor is connected an output circuit of a further transistor of the first type and, between the junction points of the output circuit of the further transistor and the input circuit of the output transistor, and of the output circuits of the output transistor and the transistor connected as a diode, the output circuit of a switching transistor of the first type is connected in series with a resistor, that is in series with the output circuit of the transistor connected as a diode, the output circuit of an input transistor of the second type is connected and the input thereof is connected to another resistor, the transistor connected as a diode being connected at its free terminal to the input circuit of the further transistor, and that the inputs of the input transistor and of the switching transistor form the respective inputs of the voltage-controlled reference current source.

22. Dynamic control system according to claim 21, including at least two parallel output transistors included in the voltage controlled reference source; an electronic switch connected at one side to one of the output transistors, a capacitor connected at one terminal to the other side of the electronic switch; a further electronic switch; a first current mirror transistor controllably connected to the further electronic switch; a second current mirror transistor connected in series with said first current mirror transistor, at least one transistor connected as a diode connected in series with the further electronic switch, said diode-connected transistors being connected in series with the other one of said output transistors.

23. Dynamic control system according to claim 8, the system being constructed as a digital system.

24. Dynamic control system according to claim 8, the system being constructed as an analog system.

25. Method for operating a dynamic control system having a control loop and including a switch being controlled by a plurality of time-variable parameters and having time-invariant switchable system parameters, which comprises the steps of: switching-over the switch in dependence on at least one of: the state of the system parameters, the state of an adjusting device, the state of system parameters of the control system, the state of a comparator, and the state of a measuring device; and responding to at least one of: an interference quantity, and a reference variable and in dependence on a time-variant variable.

26. Method according to claim 25, for operating a dynamic control system, characterized by switching-over the switching the mode as one of: discrete switching and continuous switching.

27. Method for operating a dynamic control system according to claim 26, including switching the system parameters depending on the state of a phase detector and depending on the sign of the control difference ($\phi$d) to be formed by said phase detector.

28. Method according to claim 27, for operating a dynamic control system including current source switches that are switched, including: switching the current source switches under control of complementary branches of control networks having control outputs, alternatingly charging and discharging a capacitor controlling a voltage-controlled oscillator.

* * * * *